United States Patent
Shibagaki et al.

(10) Patent No.: US 7,807,553 B2
(45) Date of Patent: Oct. 5, 2010

(54) SUBSTRATE HEATING APPARATUS AND SEMICONDUCTOR FABRICATION METHOD

(75) Inventors: Masami Shibagaki, Fuchu (JP); Kenji Numajiri, Chofu (JP); Akihiro Egami, Kawasaki (JP); Akira Kumagai, Kofu (JP); Susumu Akiyama, Tokyo (JP)

(73) Assignee: Canon Anelva Corporation, Kawasaki-shi (JP)

( * ) Notice: Subject to any disclaimer, the term of this patent is extended or adjusted under 35 U.S.C. 154(b) by 412 days.

(21) Appl. No.: 11/951,807

(22) Filed: Dec. 6, 2007

(65) Prior Publication Data
US 2008/0213988 A1    Sep. 4, 2008

(30) Foreign Application Priority Data

Dec. 8, 2006  (JP)  ............................... 2006-331251
Nov. 13, 2007  (JP)  ............................... 2007-294859

(51) Int. Cl.
*H01L 21/265*  (2006.01)
*C23C 16/00*  (2006.01)

(52) U.S. Cl. .................... 438/522; 438/530; 118/725; 392/418

(58) Field of Classification Search ................ 438/514, 438/522, 530; 118/725; 219/390; 392/416, 392/418
See application file for complete search history.

(56) References Cited

U.S. PATENT DOCUMENTS

| | | | |
|---|---|---|---|
| 7,091,138 B2 | 8/2006 | Numasawa et al. | 438/778 |
| 7,317,172 B2 * | 1/2008 | Lee et al. | 219/390 |
| 7,402,505 B1 | 7/2008 | Krivokapic | 438/486 |
| 7,585,564 B2 | 9/2009 | Whiteford et al. | 428/402 |
| 2004/0150865 A1 | 8/2004 | Chen et al. | 359/252 |
| 2004/0197943 A1 | 10/2004 | Izumi et al. | 438/22 |
| 2006/0182966 A1 | 8/2006 | Lee et al. | 428/375 |
| 2006/0249073 A1 | 11/2006 | Asaoka et al. | 117/84 |
| 2007/0194001 A1 * | 8/2007 | Shibagaki et al. | 219/390 |
| 2008/0128969 A1 | 6/2008 | Shibagaki et al. | 269/287 |

FOREIGN PATENT DOCUMENTS

| | | |
|---|---|---|
| JP | 01-145312 | 6/1989 |
| JP | 5-047782 | 2/1993 |

(Continued)

OTHER PUBLICATIONS

M. Shibagaki, et al., "Impact of EBAS Annealing on Sheet Resistance Reduction for Al-Implanted 4H-SiC (0001)", Mater. Res. Soc. Symp. Proc., vol. 911 (2006).

(Continued)

*Primary Examiner*—Kevin M Picardat
(74) *Attorney, Agent, or Firm*—Fitzpatrick, Cella, Harper & Scinto

(57) ABSTRACT

A substrate heating apparatus having a heating unit for heating a substrate placed in a process chamber which can be evacuated includes a suscepter which is installed between the heating unit and a substrate, and on which the substrate is mounted, and a heat receiving member which is installed to oppose the suscepter with the substrate being sandwiched between them, and receives heat from the heating unit via the suscepter. A ventilating portion which allows a space formed between the heat receiving member and substrate to communicate with a space in the process chamber is formed.

10 Claims, 7 Drawing Sheets

FOREIGN PATENT DOCUMENTS

| | | |
|---|---|---|
| JP | 6-216333 | 8/1994 |
| JP | 10-045474 | 2/1998 |
| JP | 2002-076358 | 3/2002 |
| JP | 2004-022715 | 1/2004 |
| JP | 2004-119615 | 4/2004 |
| JP | 2004-297034 | 10/2004 |
| JP | 2005-074556 | 3/2005 |
| JP | 2005-236080 | 9/2005 |
| JP | 2006-120663 | 5/2006 |
| JP | 2006-176859 | 7/2006 |
| KR | 1999-0037189 | 10/1999 |
| KR | 19990037189 | * 10/1999 |
| KR | 10-2005-0120930 | 12/2005 |
| WO | WO 2006/043530 | 4/2006 |
| WO | WO 2006/043531 | 4/2006 |
| WO | 2008/136126 | 11/2008 |
| WO | 2008/142747 | 11/2008 |

OTHER PUBLICATIONS

S. Krishnaswami, et al., "A Study on the Reliability and Stability of High Voltage 4H-SiC Mosfet Devices", Materials Science Forum, vols. 527-529, pp. 1313-1316 (2006).

M. Shibagaki, et al., "Development of the Novel Electron Bombardment Anneal System (EBAS) for SiC Post Ion Implantation Anneal", Materials Science Forum, vols. 483-485, pp. 609-612 (2005).

M.A. Capano, et al., "Dopant Activation and Surface Morphology of Ion Implanted 4H- and 6H-Silicon Carbide", Journal of Electronic Materials, vol. 27, No. 4, pp. 370-376 (1998).

Y. Negoro, et al., "Technological Aspects of Ion Implantation in SiC Device Processes", Materials Science Forum, vol. 483-485, pp. 599-604 (2005).

M. Rambach, et al., "Annealing of Aluminum Implanted 4H-SiC: Comparison of Furnace and Lamp Annealing", Materials Science Forum, vols. 483-485, pp. 621-624 (2005).

M. Shibagaki, et al., "Development and Investigation of EBAS-100 of 100 mm Diameter Wafer for 4H-SiC Post Ion Implantation Annealing", Materials Science Forum, vols. 527-529, pp. 807-810 (2006).

J. Senzaki, et al., "Influences of Postimplantation Annealing Conditions on Resistance Lowering in High-Phosphorus-Implanted 4H-SiC", Journal of Applied Physics, vol. 94, No. 5, pp. 2942-2947 (Sep. 1, 2003).

Shibagaki, M., et al., "Development of the Novel Bombardment Anneal System (EBAS) for SiC Post Ion Implantation Anneal," Materials Science Forum, vols. 483-485, p. 609-612 (2005).

Kimoto, T. et al., "Nitrogen Ion Implantation into $\alpha$-SiC Epitaxial Layers," Phys. Stat. Sol., vol. 162, p. 263-276 (1997).

A. Egami, et al., "Evaluation of Correlation Between Annealing Ambient and the Surface Roughening of $N^+$ Implanted 4H-SiC EBAS Annealing", Proceedings of the $25^{th}$ Symposium on Materials Science and Engineering Research Center of Ion Beam Technology, pp. i-ii, 33-36 (Dec. 8, 2006).

* cited by examiner

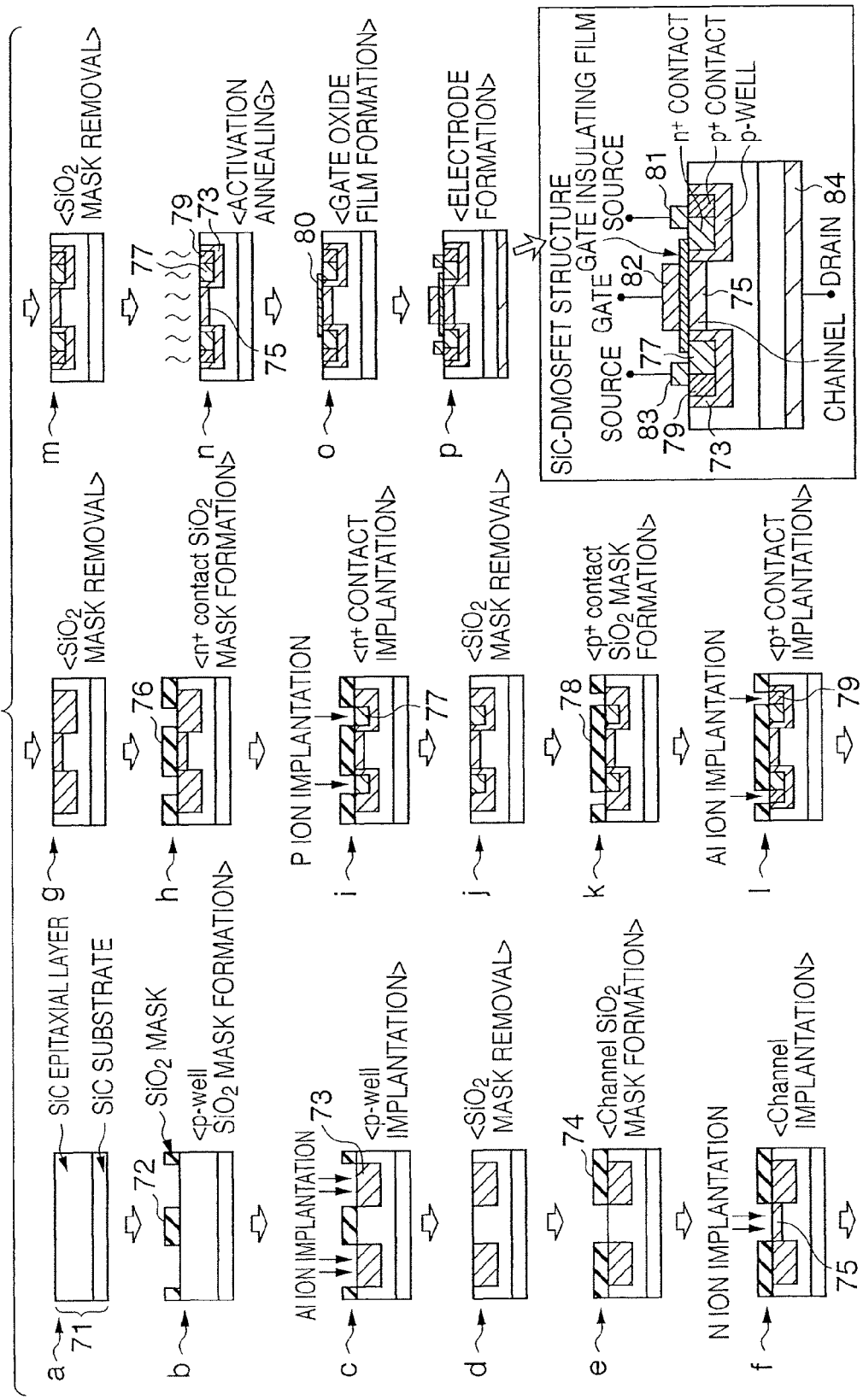

SUBSTRATE HEATING APPARATUS AND SEMICONDUCTOR FABRICATION METHOD

BACKGROUND OF THE INVENTION

1. Field of the Invention

The present invention relates to a substrate heating apparatus and semiconductor fabrication method used in a semiconductor substrate heating process.

2. Description of the Related Art

Annealing for processing a semiconductor substrate at a high temperature has been conventionally extensively used. For example, a process of activating an ion-implanted impurity and a rapid thermal process (rapid thermal anneal) for, for example, recovering crystal defects caused by ion implantation are widely performed.

When a silicon carbide (SiC) substrate is used, for example, the material characteristics suppress thermal diffusion, and local dopant control uses ion implantation. However, SiC crystals sometimes break when implanting impurity ions accelerated by high energy. A high-temperature heating process is performed to electrically activate the implanted impurity by recrystallizing the almost amorphousized sic.

This substrate heating process is performed by a semiconductor fabrication apparatus, or performed in a semiconductor fabrication step by a substrate heating apparatus which includes a heating means for heating a substrate placed in a process chamber that can be evacuated, and heats a substrate placed in the process chamber by the heating means.

For example, an apparatus denoted by reference numeral 100 in FIG. 1 is conventionally known as the substrate heating apparatus. In the substrate heating apparatus 100, a heating means 104 installed in a susceptor 102 in a process chamber 101 that can be evacuated by an evacuating means (not shown) heats a substrate 103 placed on the susceptor 102.

As the heating means 104, a high-frequency induction heating means, a thermal electron generating means for electron bombardment heating, an infrared lamp, or the like is used.

The heating process of a semiconductor substrate, particularly, the heating process of an SiC substrate is performed at a high temperature of about 1,500° C. to 2,000° C.

In this substrate heating process, the substrate heating apparatus 100 as shown in FIG. 1 cannot evenly heat the substrate 103 very well.

Accordingly, a substrate heating apparatus 110 as shown in FIGS. 2A and 2B has been proposed (International Publication WO2006/043530).

The substrate heating apparatus 110 includes a heating means 104 for heating a substrate 103 placed in a process chamber 101 that can be evacuated, and heats the substrate 103 placed in the process chamber 101 by the heating means 104. In the embodiment shown in FIGS. 2A and 2B, a susceptor 102 is installed between the heating means 104 and substrate 103. The basic structure and form are the same as those of the substrate heating apparatus 100 shown in FIG. 1.

The difference of the substrate heating apparatus 110 shown in FIGS. 2A and 2B from the substrate heating apparatus 100 shown in FIG. 1 is that a heat receiving member for receiving the heat from the heating means 104 via the susceptor 102 is installed to oppose the susceptor 102 with the substrate 103 being sandwiched between them.

In the embodiment shown in FIGS. 2A and 2B, this heat receiving member is a cap 107 that covers the substrate 103 from above the susceptor 102, thereby isolating the substrate 103 from a space 113b in the process chamber 101.

The heat receiving member such as the cap 107 that receives the heat from the heating means 104 via the susceptor 102 is installed to oppose the susceptor 102 with the substrate 103 being sandwiched between them. The substrate heating apparatus 110 shown in FIGS. 2A and 2B can achieve the remarkable effect of evenly heating the substrate 103 because the substrate 103 is placed in a closed space 113a formed by the susceptor 102 and cap 107.

Although the conventional substrate heating apparatus 110 shown in FIGS. 2A and 2B can achieve the notable effect of evenly heating the substrate 103, surface roughness sometimes occurs on the substrate 103 when a semiconductor substrate such as an SiC substrate is heated at a high temperature of about 1,500° C. to 2,000° C.

When this SiC substrate having a roughened surface is used in a MOSFET (MOS Field Effect Transistor), the channel mobility in the MOSFET decreases.

That is, when forming a MOSFET or the like by using an SiC substrate having a roughened surface, a gate insulating film and the like are formed on the roughened surface of the SiC substrate, so no good interface can be obtained. As a consequence, the performance as a transistor deteriorates. Also, even when simply forming a contact with a metal, the contact resistance may rise if the metal is brought into contact with the roughened surface.

A gas discharged from the surfaces of the susceptor 102 and cap 107 presumably has influence on the surface roughness that occurs when a semiconductor substrate such as an SiC substrate is heated at a high temperature.

Accordingly, it is proposed to form coatings 108 and 109 made of a material that discharges no gas during the substrate heating process, on that surface of the susceptor 102 installed between the heating means 104 and substrate 103, on which the substrate 103 is placed, and on that surface of the cap 107 as the heat receiving member, which faces the substrate 103. The coatings 108 and 109 suppress the surface roughness of the substrate 103 caused by the gas discharged from the susceptor 102 and cap 107 during the substrate heating process.

It is possible to achieve the remarkable effects of evenly heating the substrate 103 and suppressing the surface roughness by installing the heat receiving member such as the cap 107 that receives the heat from the heating means 104 via the susceptor 102, so as to oppose the susceptor 102 with the substrate 103 being sandwiched between them, and by forming the coatings 108 and 109 made of a material that discharges no gas during the substrate heating process, on that surface of the susceptor 102 on which the substrate 103 is placed, and on that surface of the cap 107 which faces the substrate 103.

Even when the coatings 108 and 109 are formed, however, it is difficult to completely eliminate the problem that the surface roughness occurs on the substrate 103 during the heating process. Therefore, the present inventor made extensive studies to heat a substrate more evenly and eliminate the surface roughness more reliably.

Consequently, the present inventor has found that even when the coatings 108 and 109 made of a material that discharges no gas during the substrate heating process are formed to suppress the discharge of a gas from the susceptor 102 and cap 107, the cap 107 or the like may discharge a gas through an incompletely coated portion or fine pinhole. The present inventor has also found that the cap 107 or the like may discharge a gas due to the grain boundaries formed during the heating process performed at a high temperature of about 1,500° C. to 2,000° C.

SUMMARY OF THE INVENTION

It is, therefore, an object of the present invention to provide a substrate heating apparatus and semiconductor fabrication method capable of performing a uniform substrate heating process, and also capable of suppressing the surface roughness of a substrate under heating caused by the existence of a gas in the ambient surrounding the substrate.

To achieve the above object, a substrate heating apparatus and semiconductor fabrication method proposed by the present invention are as follows.

According to one aspect of the present invention, there is provided a substrate heating apparatus having heating means for performing a heating process on a substrate placed in a process chamber adapted to be evacuated, the apparatus comprising: a susceptor which is installed between the heating means and a substrate, and on which the substrate is mounted; and a heat receiving member which is installed to oppose the susceptor with the substrate being sandwiched therebetween, and receives heat from the heating means via the susceptor, wherein a ventilating portion which causes a space formed between the heat receiving member and the substrate to communicate with a space in the process chamber is formed.

According to another aspect of the present invention, there is provided a semiconductor fabrication method having a substrate heating step of heating a substrate placed in a process chamber adapted to be evacuated, the substrate heating step comprising steps of: placing a substrate on a susceptor incorporating heating means; covering the substrate from above the susceptor by a heat receiving member having a ventilating portion; evacuating the process chamber; and heating the substrate by the heating means after an interior of the process chamber has reached a predetermined vacuum degree, wherein the ventilating portion is formed to cause a space formed between the heat receiving member and the substrate to communicate with a space in the process chamber, and in the step of evacuating the process chamber, a gas produced in the space formed between the heat receiving member and the substrate is evacuated through the ventilating portion.

According to still another aspect of the present invention, there is provided a semiconductor fabrication method having a substrate heating step of heating a substrate placed in a process chamber adapted to be evacuated, the method comprising steps of: forming an impurity region by implanting ions into an epitaxial layer formed on a substrate; and heating the impurity region formed in the epitaxial layer by using a substrate heating apparatus having heating means for heating the substrate placed in the process chamber adapted to be evacuated, wherein the substrate heating apparatus comprises: a susceptor which is installed between the heating means and a substrate, and on which the substrate is mounted; and a heat receiving member which is installed to oppose the susceptor with the substrate being sandwiched therebetween, and receives heat from the heating means via the susceptor, and a ventilating portion which causes a space formed between the heat receiving member and the substrate to communicate with a space in the process chamber is formed.

The existence of the heat receiving member allows even heating of a substrate. At the same time, the existence of the ventilating portion makes it possible to increase the exhaust conductance around the substrate under heating, and suppress the surface roughness of the substrate caused by the discharge of a gas from the heat receiving member or the like to the ambient surrounding the substrate.

Further features of the present invention will become apparent from the following description of exemplary embodiments (with reference to the attached drawings).

BRIEF DESCRIPTION OF THE DRAWINGS

FIG. 7 is a view for explaining a semiconductor device fabrication process.

DESCRIPTION OF THE EMBODIMENTS

Preferred embodiments of the present invention will be explained in detail below as examples with reference to the accompanying drawings. However, constituent elements described in these embodiments are merely examples, and the scope of the present invention is not limited to these constituent elements.

First Embodiment

Figure 3A:
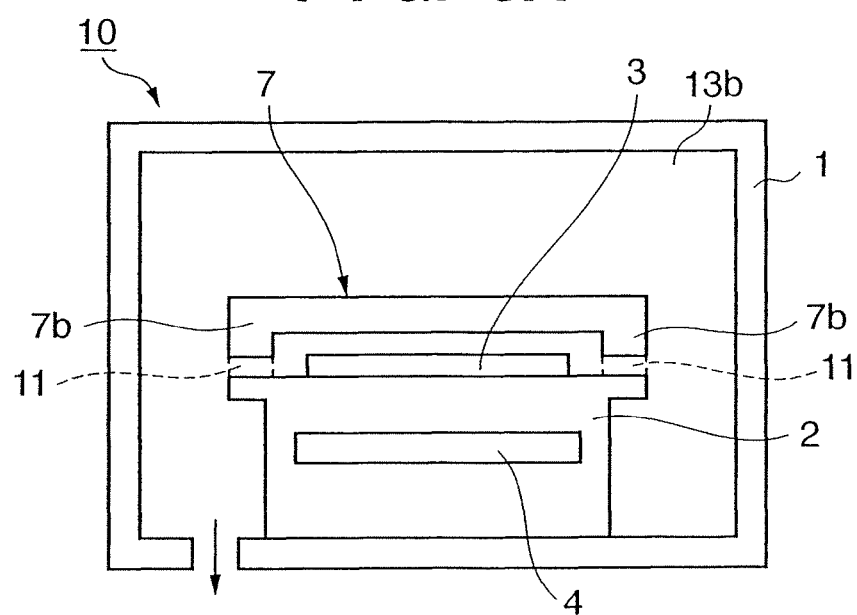
FIG. 3A is a sectional view for explaining an outline of the structure of the first embodiment of a substrate heating apparatus according to the present invention.
Figure 3B:
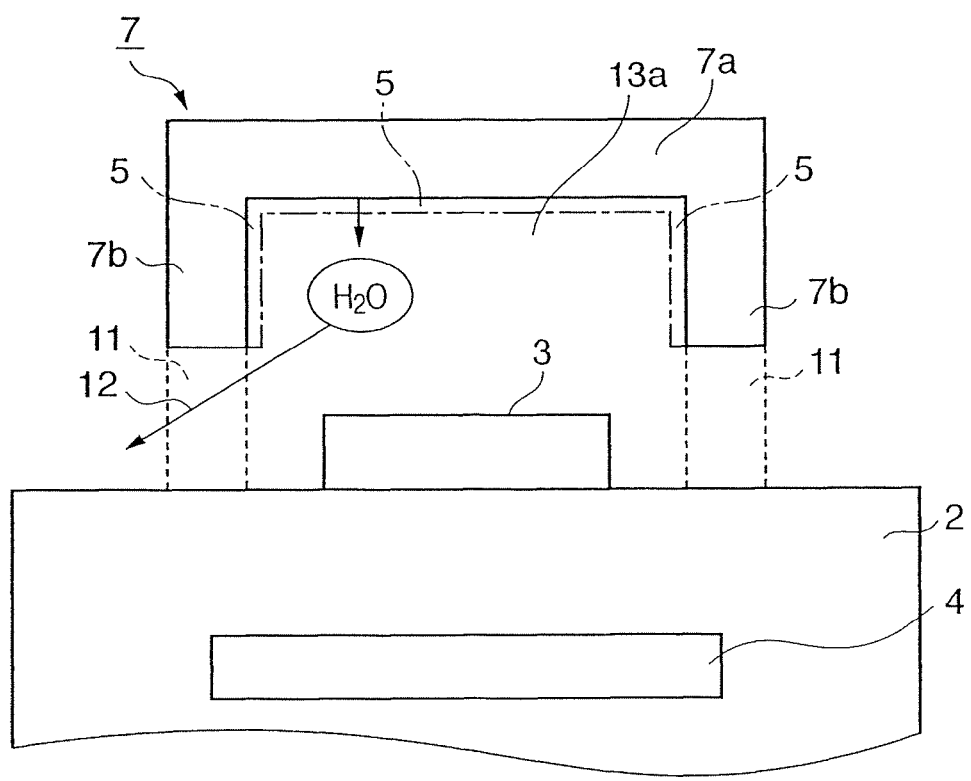
FIG. 3B is an enlarged view for explaining a space formed between a substrate and heat receiving member in the first embodiment shown in FIG. 3A.

FIGS. 3A and 3B are views for explaining a preferred embodiment of the present invention.

A substrate heating apparatus 10 shown in FIG. 3A includes a heating means 4 for heating a substrate (semiconductor substrate) 3 placed in a process chamber 1 that can be evacuated by an evacuating means (not shown), and heats the substrate 3 placed in the process chamber 1 by the heating means 4.

The heating means 4 is incorporated into a susceptor 2, and the substrate 3 to be heated is placed on the upper surface of a substrate support in the upper portion of the susceptor 2.

In this manner, the susceptor 2 is installed between the heating means 4 and substrate 3.

Also, a heat receiving member for receiving the heat from the heating means 4 via the susceptor 2 is installed to oppose the susceptor 2 with the substrate 3 being sandwiched between them.

In the embodiment shown in FIGS. 3A and 3B, this heat receiving member includes a top plate 7a, and a cylindrical circumferential wall 7b extending downward from the edge of the top plate 7a. As shown in FIGS. 3A and 3B, the heat receiving member is a cap 7 that covers the substrate 3 from above the susceptor 2, thereby isolating the substrate 3 from a space 13b in the process chamber 1.

The cap 7 has a through hole 11 extending through the circumferential wall 7b in its radial direction.

The through hole 11 is formed between a space 13a formed between the cap 7 as the heat receiving member and the substrate 3, and the space 13b in the process chamber 1. The through hole 11 is a ventilating portion that allows the space 13a formed between the cap 7 as the heat receiving member and the substrate 3 to communicate with the space 13b in the process chamber 1.

A plurality of through holes 11 as ventilating portions can be formed at predetermined intervals in the circumferential direction of the circumferential wall 7b.

In this embodiment shown in FIGS. 3A and 3B, the substrate 3 to be heated is placed on the susceptor 2 incorporating the heating means 4. Therefore, the substrate 3 is directly evenly heated from the susceptor 2.

Also, the top plate 7a of the cap 7 covering the substrate 3 on the susceptor 2 from above opposes the substrate 3. This makes it possible to suppress the radiation of heat from the heated substrate 3 and increase the efficiency of uniform heating of the substrate 3, thereby achieving sufficient activation.

In addition, the through hole 11 as the ventilating portion that allows the space 13a formed between the cap 7 as the heat receiving member and the substrate 3 to communicate with the space 13b in the process chamber 1 is formed in the circumferential wall 7b of the cap 7. Accordingly, the exhaust conductance around the substrate 3 under heating can be increased.

Consequently, even when the cap 7 discharges a gas containing water or the like, for example, this gas is immediately exhausted through the through hole 11 as indicated by an arrow 12. This makes it possible to suppress the influence on the substrate 3 caused by the discharge of a gas from, for example, the cap 7 as the heat receiving member to the ambient around the substrate 3 under heating.

For example, even when the residual gas exists in the space 13a formed between the cap 7 and substrate 3, or even when a gas is discharged into the space 13a by imperfect coating or the like although a coating 5 made of a material that discharges no gas during the substrate heating process is formed on that inner wall surface of the cap 7 which faces the space 13a, the gas is immediately exhausted through the through hole 11 as indicated by the arrow 12. Accordingly, the time of stay of the molecules of the gas discharged into the space 13a can be shortened.

This makes it possible to suppress the influence on the substrate 3 caused by the discharge of a gas from the cap 7 and the like, and achieve uniform heating and sufficient activation without any surface roughness.

Note that it is possible to use, for example, a thermal electron generating means for electron bombardment heating or an infrared lamp for infrared lamp heating as the heating means 4.

The susceptor 2 and cap 7 can be formed by using silicon carbide (SiC) or carbon, more preferably, carbon processed to have high purity.

When the substrate 3 to be heated is a silicon carbide (SiC) substrate, the heating process is sometimes performed at a high temperature of 2,000° C. The discharge of a gas from the susceptor 2 and cap 7 in this high-temperature region can be suppressed by forming the susceptor 2 and cap 7 by SiC or carbon processed to have high purity.

Furthermore, although not shown, it is also possible to form a coating made of a material that discharges no gas during the substrate heating process on that surface of the susceptor 2 installed between the heating means 4 and substrate 3, on which the substrate 3 is placed, and the coating 5 made of a material that discharges no gas during the substrate heating process on that surface of the cap 7 as the heat receiving member, which faces the substrate 3. This makes it possible to more effectively prevent the surface roughness of the substrate 3 caused by a gas discharged from the susceptor 2 and cap 7 during the substrate heating process.

When the process conditions of a high-temperature process of a semiconductor substrate such as an SiC substrate are taken into consideration, the coating can be made of a material such as pyrolytic graphite or pyrolytic carbon that discharges no gas when the pressure is $10^{-4}$ Pa to the atmospheric pressure, the temperature is 800° C. to 2,300° C., and the process time is 1,800 sec or less. It is also possible to use various other materials as long as they discharge no gas under the above conditions.

The thickness of the coating is desirably 20 to 40 μm.

As described above, after the susceptor 2 and cap 7 are formed by using carbon, the coating layer made of pyrolytic carbon can be formed on the surfaces of the susceptor 2 and cap 7. Alternatively, the susceptor 2 and cap 7 can be formed by using pyrolytic carbon.

After the process of heating the substrate 3 is performed as described above and the temperature of the cap 7 has lowered, the cap 7 is removed from above the susceptor 2 manually (in the case of a manual apparatus) or by a predetermined transfer mechanism (in the case of an automatic apparatus). Then, the heated substrate 3 is unloaded from the process chamber 1. Subsequently, the substrate 3 to be heated next is loaded and placed on the susceptor 2, and covered with the cap 7 as shown in FIG. 3A. After that, the process chamber 1 is evacuated, and the heating means 4 performs the heating process.

In the substrate heating apparatus 10 of the present invention as described previously, the through hole 11 as the ventilating portion that allows the space 13a formed between the cap 7 as the heat receiving member and the substrate 3 to communicate with the space 13b in the process chamber 1 is formed to increase the exhaust conductance around the substrate 3 under heating.

Accordingly, even when the residual gas exists in the space 13a formed between the cap 7 and substrate 3 or a gas containing water or the like is discharged from the cap 7, or even when a gas is discharged into the space 13a due to imperfect coating or the like although the coating 5 made of a material that discharges no gas during the substrate heating process is formed on that inner wall surface of the cap 7 which faces the space 13a, the gas is immediately exhausted through the through hole 11 as indicated by the arrow 12. The arrangement shown in FIGS. 3A and 3B makes it possible to shorten the time of stay of the molecules of a gas discharged into the space 13a, thereby suppressing the influence on the substrate 3 caused by the discharge of a gas from the cap 7 and the like to the ambient around the substrate 3 under heating.

The size and number of the through hole 11 can be determined so as to effectively achieve the above-mentioned functions.

For example, the size and number of through holes 11 can be determined to obtain an aperture by which $C>0.01$ S, preferably, $C>0.1$ S.

S (litter (L)/sec (S)) is the overall exhaust rate of the process chamber 1.

C (litter (L)/sec (S)) is the exhaust rate between the space 13a formed between the cap 7 and substrate 3, and the space 13b in the process chamber 1.

That is, it is desirable to determine the size and number of through holes 11 so as to obtain an aperture which produces a two-order-of-magnitude vacuum degree difference between the space 13a formed between the cap 7 as the heat receiving member and the substrate 3, and the space 13b in the process chamber 1.

Note that the exhaust rate C is calculated from the aperture of the through hole 11 as the ventilating portion that allows the space 13a formed between the cap 7 as the heat receiving member and the substrate 3 to communicate with the space 13b in the process chamber 1.

FIGS. 4A to 4D are views for explaining various forms that the cap 7 as the heat receiving member can take.

Figure 4A:
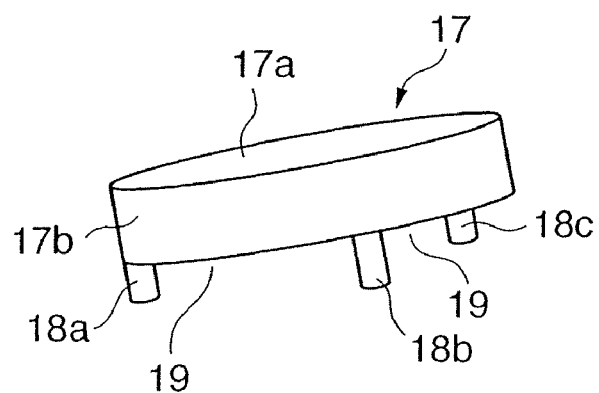
FIGS. 4A to 4D are perspective views for explaining embodiments of the heat receiving member in the substrate heating apparatus of the present invention.
Figure 4B:
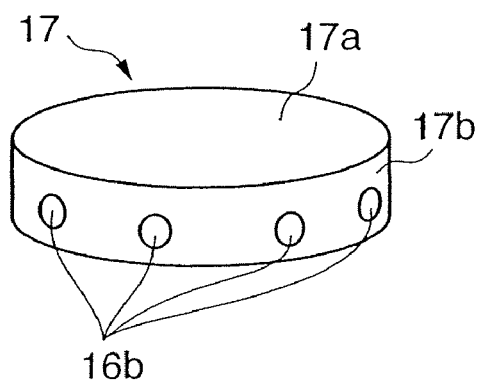

In each of caps 17 shown in FIGS. 4A and 4B, ventilating portions that allow the space 13a formed between the cap 17 as the heat receiving member and the substrate 3 to communicate with the space 13b in the process chamber 1 are formed in a circumferential wall 17b of the cap 17.

The lower end portion of the cap 17 shown in FIG. 4A has legs 18a, 18b, and 18c arranged at predetermined intervals in the circumferential direction. Spaces 19 between the legs 18a, 18b, and 18c function as ventilating portions that allow the space 13a formed between the heat receiving member and substrate 3 to communicate with the space 13b in the process chamber 1.

The cap 17 shown in FIG. 4B has through holes 16b formed in the circumferential wall 17b at predetermined intervals in the circumferential direction. The through holes 16b form ventilating portions that allow the space 13a formed between the heat receiving member and substrate 3 to communicate with the space 13b in the process chamber 1.

In the substrate heating apparatus 10 of the present invention having the cap 17 shown in FIG. 4A or 4B, the heat receiving member is the cap 17 that includes a top plate 17a and the cylindrical circumferential wall 17b extending downward from the edge of the top plate 17a, and isolates the substrate 3 from the space 13b in the process chamber 1 by covering the substrate 3 from above the suscepter 2. Therefore, it is possible to more reliably suppress the radiation of heat from the substrate 3, thereby performing even substrate heating and sufficient activation.

Also, the spaces 19 or through holes 16b allow the space 13a formed between the heat receiving member and substrate 3 to communicate with the space 13b in the process chamber 1. This makes it possible to prevent gas from staying for a long time around the substrate 3 under heating, thereby effectively suppressing the surface roughness of the substrate 3.

Note that the number of fabrication steps of the form shown in FIG. 4A is smaller than that of the form shown in FIG. 4B in which the through holes 16b are formed.

Figure 1:
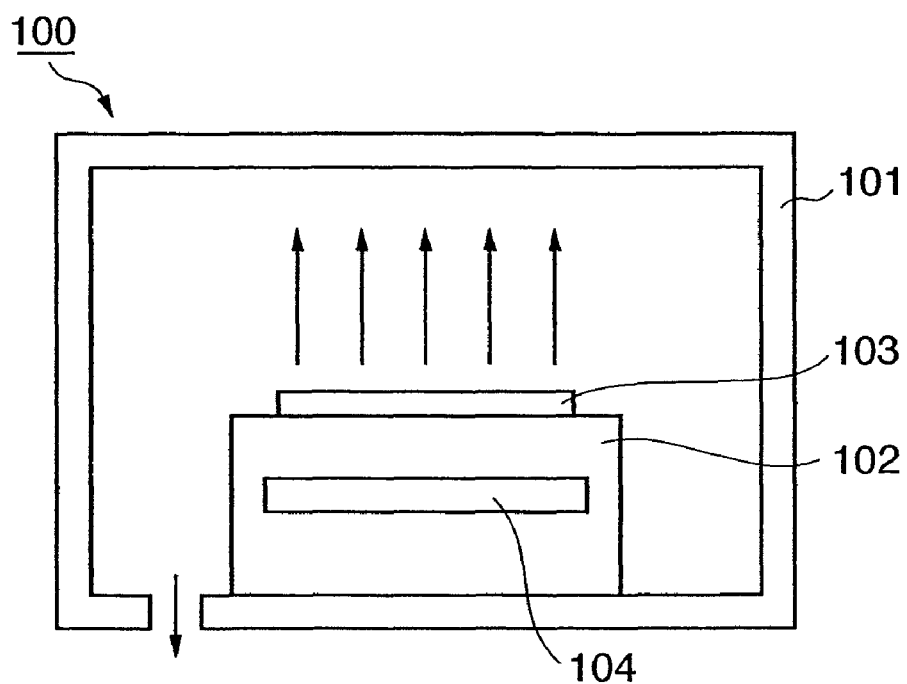
FIG. 1 is a sectional view for explaining an outline of the structure of an example of the conventional substrate heating apparatus.
Figure 2A:
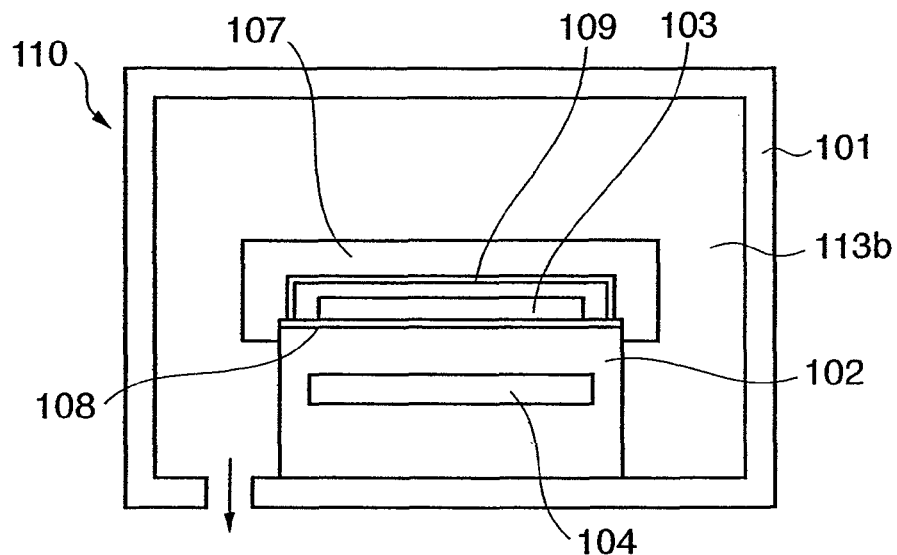
FIG. 2A is a sectional view for explaining an outline of the structure of another embodiment of the conventional substrate heating apparatus.
Figure 2B:
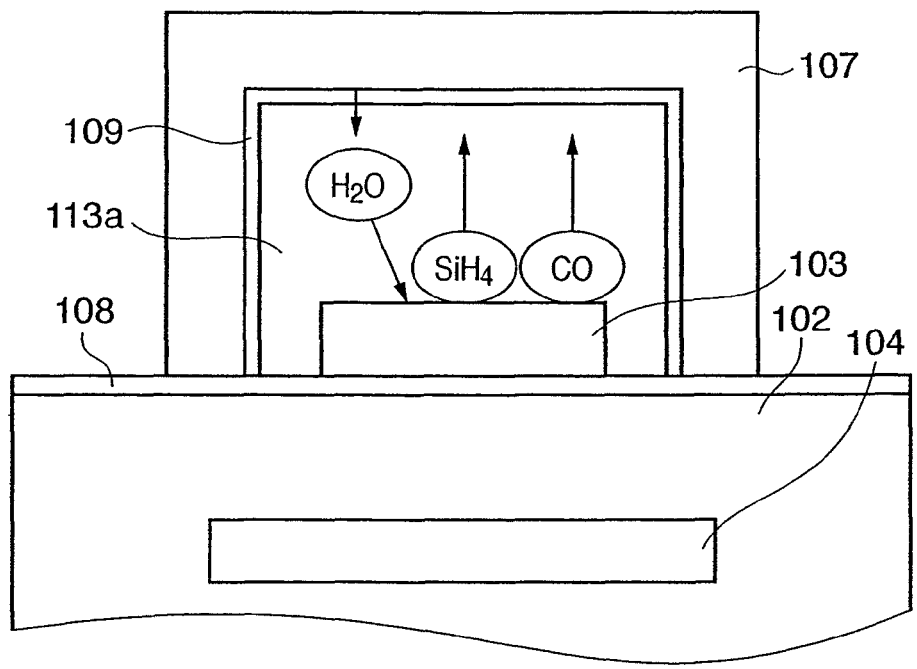
FIG. 2B is an enlarged view for explaining the state of a space formed between a substrate and heat receiving member in the embodiment shown in FIG. 2A.

Note also that when forming the coating 5 (FIG. 3B) made of a material that discharges no gas during the substrate heating process on that inner wall surface of the cap 17 which faces the space 13a as explained in the prior art shown in FIGS. 2A and 2B, this coating can be formed more inexpensively in the form shown in FIG. 4A than in the form shown in FIG. 4B.

Figure 4C:
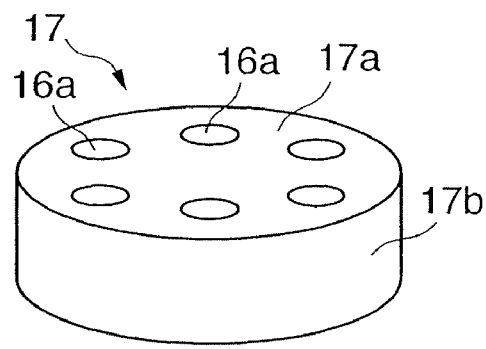

In the cap 17 shown in FIG. 4C, ventilating portions that allow the space 13a formed between the cap 17 as the heat receiving member and the substrate 3 to communicate with the space 13b in the process chamber 1 are formed in the top plate 17a of the cap 17.

The exhaust conductance can be increased more easily because the ventilating portions that allow the space 13a formed between the heat receiving member and substrate 3 to communicate with the space 13b in the process chamber 1 are formed in the top plate 17a of the cap 17.

In the embodiment shown in FIG. 4C, the ventilating portions formed in the top plate 17a to allow the spaces 13a and 13b to communicate with each other are a plurality of through holes 16a formed in predetermined positions of the top plate 17a.

In the embodiment shown in FIG. 4C, the through holes 16a having the same size are formed at predetermined intervals in the circumferential direction at circumferential positions equal in the radial direction from the center of the top plate 17a.

The uniformity of the heat distribution can be improved by adjusting the positions, size, number, and area of through holes 16a by, for example, forming a large number of through holes 16a in a central portion and a small number of through holes 16a in a peripheral portion.

Figure 4D:
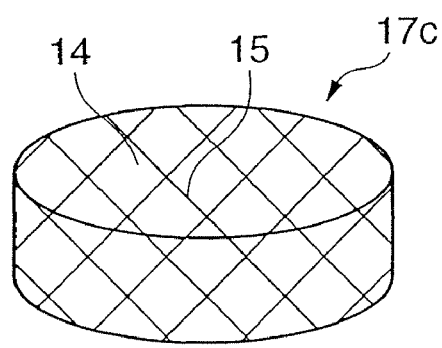

In the embodiment shown in FIG. 4D, the heat receiving member is a cap-like member 17c made of a net material that isolates the substrate 3 from the space 13b in the process chamber 1 by covering the substrate 3 from above the suscepter 2.

Meshes 14 formed between sides 15 forming the net material function as ventilating portions that allow the space 13a formed between the heat receiving member and substrate 3 to communicate with the space 13b in the process chamber 1.

In the embodiment shown in FIG. 4D, the cap-like member 17c made of the net material as the heat receiving member is placed on the suscepter 2 so as to cover the substrate 3 from above. This makes it possible to suppress the radiation of heat from the heated substrate 3, thereby achieving more efficient heating and sufficient activation.

It is also possible to increase the exhaust conductance more easily because the meshes 14 of the cap-like member 17c made of the net material form the ventilating portions that allow the space 13a formed between the cap-like member 17c made of the net material and the substrate 3 to communicate with the space 13b in the process chamber 1.

As described previously, the sizes, numbers, and the like of spaces 19 (FIG. 4A), through holes 16b (FIG. 4B), through holes 16a (FIG. 4C), and meshes 14 (FIG. 4D) corresponding to the ventilating portions that allow the spaces 13a and 13b to communicate with each other in the embodiments shown in FIGS. 4A to 4D can also be determined to obtain an aperture by which $C > 0.01\ S$.

Note that S (litter (L)/sec (S)) is the overall exhaust rate of the process chamber 1, and C (litter (L)/sec (S)) is the exhaust rate between the space 13a formed between the cap-like member 17c made of the net material and the substrate 3, and the space 13b in the process chamber 1, in this inequality as well.

An example of a semiconductor fabrication method of the present invention using the substrate heating apparatus 10 of the present invention shown in FIGS. 3A and 3B will be explained below.

A substrate transfer apparatus (not shown) mounts the substrate (SiC substrate) 3 to be heated on the suscepter 2 incorporating the heating means 4 in the process chamber 1 that can be evacuated.

Then, the heat receiving member having the ventilating portion covers the substrate 3 from above the suscepter 2. More specifically, the cap 7 having the through hole 11 covers the substrate 3 from above the suscepter 2 (FIG. 3A).

An evacuating means (not shown) evacuates the process chamber 1 to a predetermined vacuum degree, for example, $10^{-4}$ Pa.

Even when a gas exists in the space 13a formed between the cap 7 and substrate 3, this gas is immediately exhausted from the space 13a to the space 13b in the process chamber 1 as indicated by the arrow 12 because the cap 7 has the through hole 11.

Subsequently, the heating means 4 performs a heating process at a predetermined high temperature (e.g., 2,000° C.) for a predetermined time (e.g., 300 sec).

The semiconductor fabrication method of the present invention includes the substrate heating step as describe above.

After the heating process is complete and the temperature of the cap 7 has lowered, the cap 7 is removed from above the suscepter 2 manually (in the case of a manual apparatus) or by a predetermined transfer mechanism (in the case of an automatic apparatus), and the heated substrate 3 is unloaded from the process chamber 1.

Then, the substrate 3 to be heated next is loaded into the process chamber 1 and placed on the suscepter 2. After that, the cap 7 is placed as shown in FIG. 3A, and the process chamber 1 is evacuated. When a detecting means (not shown) detects that the interior of the process chamber 1 is set in a predetermined vacuum state, the heating means 4 performs the heating process.

The present inventors conducted experiments, that is, performed an SiC substrate heating process under the same process conditions by using (1) the substrate heating apparatus (the embodiment) of the present invention shown in FIG. 3A, (2) a substrate heating apparatus (Comparative Example 1) that was the same as the substrate heating apparatus of the present invention shown in FIG. 3A except that no through hole 11 was formed in the cap 7, and (3) a substrate heating apparatus (Comparative Example 2) that was the same as the substrate heating apparatus of the present invention shown in FIG. 3A except that no cap 7 was used. Consequently, the following data was obtained.

|  | AFM Image (RMS Value) | Sheet Resistance (Rs) |
| --- | --- | --- |
| (1) Embodiment | 0.29 nm | 1,780 Ω/□ |
| (2) Comparative Example 1 | 1.38 nm | 1,570 Ω/□ |
| (3) Comparative Example 2 | 0.42 nm | 2,040 Ω/□ |

The above comparisons revealed that the substrate heating apparatus according to the present invention was most superior in both of lower sheet resistance due to substrate heating and surface roughness suppression.

Second Embodiment

Figure 5A:
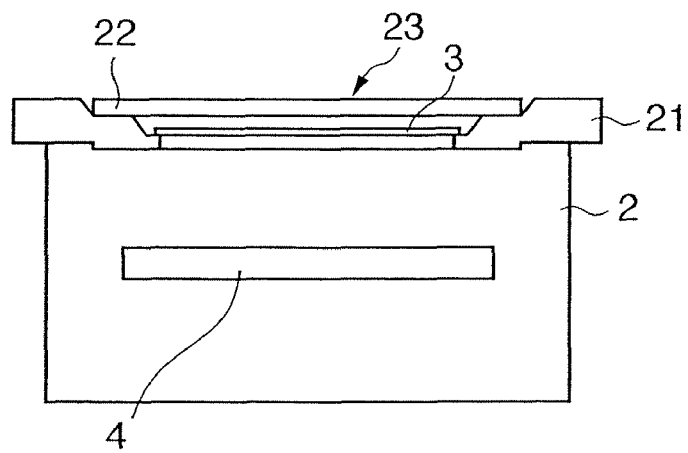
FIG. 5A is a sectional view for explaining an outline of the structure of the second embodiment of the substrate heating apparatus according to the present invention.
Figure 5B:
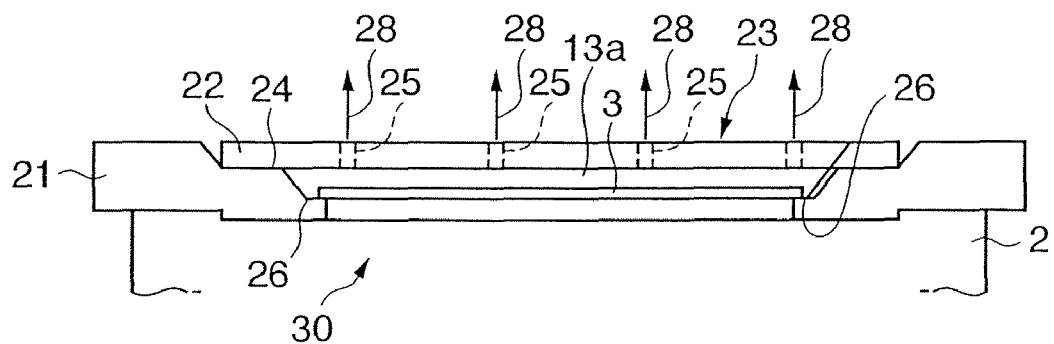
FIG. 5B is a sectional view for explaining an example of the second embodiment shown in FIG. 5A by partially omitting and partially enlarging the structure.
Figure 5C:
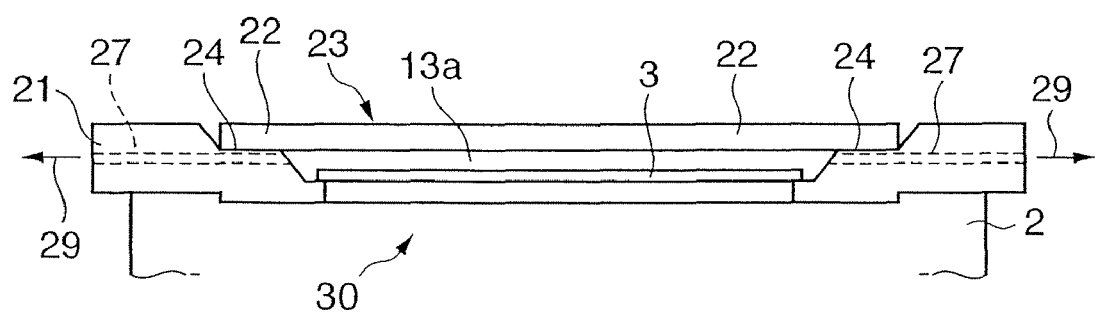
FIG. 5C is a sectional view for explaining another example of the second embodiment shown in FIG. 5A by partially omitting and partially enlarging the structure.

FIGS. 5A to 5C are views for explaining the second embodiment of the present invention.

In the second embodiment shown in FIGS. 5A to 5C, a heat receiving member is a cover member 22 placed on an upper end opening 23 of a cylindrical support member 21 to close the upper end opening 23.

That is, in this embodiment shown in FIGS. 5A to 5C, the cap 17 explained in the embodiment shown in FIGS. 3 and 4 comprises the cylindrical support member 21, and the cover member 22 placed on the upper end opening 23 of the cylindrical support member 21 to close the upper end opening 23.

A step portion 26 formed on the inner circumferential wall of a middle portion between the upper end opening 23 and a lower end opening 30 of the cylindrical support member 21 supports the edge of the bottom surface of a substrate 3 to be heated.

The cylindrical support member 21 in which the edge of the bottom surface of the substrate 3 to be heated is supported by the step portion 26 and the upper end portion 23 is closed with the cover member 22 is loaded into a process chamber 1 by a transfer means (not shown). As shown in FIG. 5B, the side of the lower end opening 30 of the support member 21 is placed on a suscepter 2.

As explained in the first embodiment, a ventilating portion that allows a space 13a formed between the heat receiving member and substrate 3 to communicate with a space 13b in the process chamber 1 is formed in the second embodiment as well.

In the arrangement shown in FIG. 5B, the ventilating portion that allows the space 13a formed between the heat receiving member and substrate 3 to communicate with the space 13b in the process chamber 1 comprises a plurality of through holes 25 formed in the cover member 22.

As indicated by arrows 28, a gas is exhausted from the space 13a formed between the heat receiving member and substrate 3 to the space 13b in the process chamber 1 through the through holes 25.

In an arrangement shown in FIG. 5C, the ventilating portion that allows the space 13a formed between the heat receiving member and substrate 3 to communicate with the space 13b in the process chamber 1 comprises a plurality of through holes 27 formed at predetermined intervals in the circumferential direction in the circumferential wall between the upper end opening 23 and the step portion 26 formed on the inner circumferential wall of the middle portion of the cylindrical support member 21.

As indicated by arrows 29, a gas is exhausted from the space 13a formed between the heat receiving member and substrate 3 to the space 13b in the process chamber 1 through the through holes 27.

The function and effect of the arrangement shown in FIG. 5B are the same as those of the substrate heating apparatus using the cap 17 shown in FIG. 4C explained in the first embodiment.

The function and effect of the arrangement shown in FIG. 5C are the same as those of the substrate heating apparatus using the cap 17 shown in FIGS. 4A and 4B explained in the first embodiment.

Furthermore, as shown in FIGS. 5A to 5C, it is also possible to facilitate positioning the substrate 3 and cover member 22 by giving the cylindrical support member 21 a drop-in structure that is tapered and inclined toward the inner circumferential surfaces.

Also, a clearance is formed between the upper surface of the suscepter 2 and the substrate 3 as shown in FIGS. 5A to 5C. Accordingly, either the upper surface or lower surface of the substrate 3 shown in FIGS. 5A to 5C can be selected as a device surface (substrate surface) on which a device is to be formed.

For example, when the substrate 3 is set in the support member 21 such that the device surface (substrate surface) opposes the suscepter 2, only the device surface (substrate surface) can be efficiently heated.

Similar to the suscepter 2, cap 7, and the like in the first embodiment, the cylindrical support member 21 and cover member 22 can be formed by using SiC or carbon, more preferably, carbon processed to have high purity.

Although not shown, it is also possible to form a 20- to 40-μm thick coating made of a material (e.g., pyrolytic graphite or pyrolytic carbon) that discharges no gas during the substrate heating process, on the surfaces of the cylindrical support member 21 and cover member 22, particularly, those surfaces of the cylindrical support 21 and cover member 22 which face the space 13a.

In this embodiment, as explained in the first embodiment, the size, number, and the like of the through holes 25 (FIG. 5B, the through holes 27 (FIG. 5C)) corresponding to the ventilating portions that allow the spaces 13a and 13b to communicate with each other can be determined to obtain an aperture by which C>0.01 S, preferably, C>0.1 S.

Note that S (litter (L)/sec (S)) is the overall exhaust rate of the process chamber 1, and C (litter (L)/sec (S)) is the exhaust rate between the space 13a formed between the heat receiving member and substrate 3, and the space 13b in the process chamber 1, in these inequalities as well.

Third Embodiment

A method of annealing a well region 62 formed by implanting an impurity into a silicon carbide (SiC) substrate 61 will be explained below with reference to FIGS. 6A and 6B.

Figure 6A:
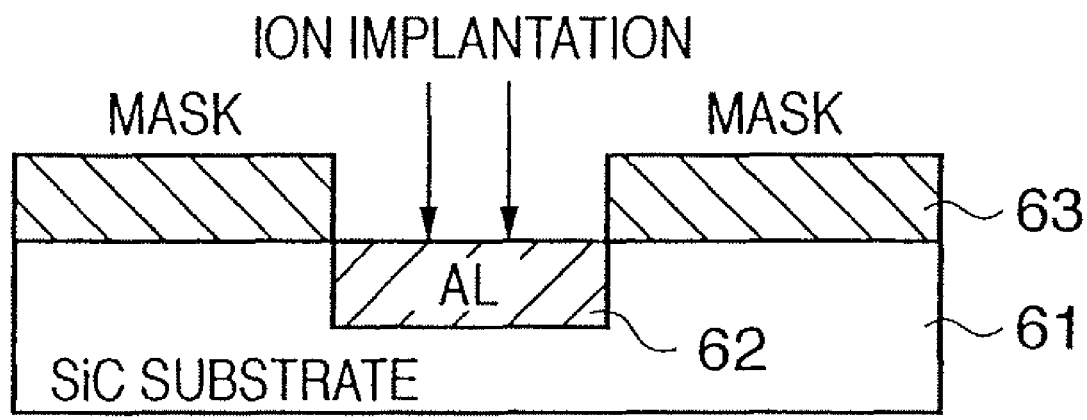
FIGS. 6A and 6B are views for explaining a method of annealing a well region formed by implanting an impurity into a silicon carbide substrate.

After sacrificial oxidation and hydrofluoric acid processing are performed, an $SiO_2$ film and the like are formed on the silicon carbide (SiC) substrate 61, a mask 63 is formed by lithography and dry etching, and aluminum ions as an impurity are implanted by an ion implantation apparatus or the like (not shown) in order to selectively form the well region 62 in the silicon carbide (SiC) substrate 61 (FIG. 6A).

Note that in this embodiment, TMA (TetraMethyl Aluminum) as an impurity source is excited by a plasma, and Al ions to be implanted are extracted by an extractor electrode and analyzer tube and implanted. However, it is also possible to excite aluminum as a source by a plasma, extract aluminum ions to be implanted by an extractor electrode and analyzer tube, and ion-implant the extracted aluminum ions.

Figure 6B:
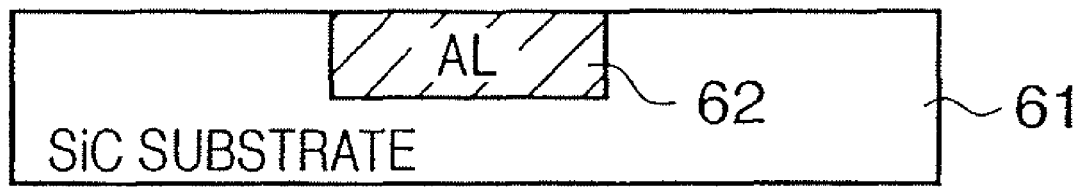

The mask is then removed, and annealing is performed using the substrate heating apparatus explained in the first or second embodiment in order to activate the well region (FIG. 6B).

Note that the substrate heating apparatus performs annealing at 1,800° C. in this embodiment, but the silicon carbide (SiC) substrate 61 may also be annealed at 1,500° C. to 2,300° C.

FIG. 7 is a view for explaining a process of fabricating a silicon carbide (SiC)-DMOSFET as an example of the semiconductor device fabrication process. In step a, an SiC substrate 71 having an SiC epitaxial layer formed on it is prepared. In step b, an $SiO_2$ mask 72 for forming two p-wells is formed by patterning. In step c, Al ions are implanted into p-well regions 73. In step d, the $SiO_2$ mask 72 is removed. In step e, a channel $SiO_2$ mask 74 having an exposed portion between the two p-wells is formed by patterning. In step f, a cannel 75 is formed by implanting N (nitrogen) ions into the channel. In step g, the channel $SiO_2$ mask 74 is removed. In step h, an $n^+$ contact formation $SiO_2$ mask 76 that partially exposes the p-wells is formed.

In step i, $n^+$ contacts 77 are formed by implanting P (phosphorus) ions into contact regions 77. In step j, the $n^+$ contact $SiO_2$ mask 76 is removed. In step k, a $p^+$ contact $SiO_2$ mask 78 is formed so as to expose the $n^+$ contact regions in the p-wells. In step l, $p^+$ contacts 79 are formed by implanting Al ions into $p^+$ contact regions 79. In step m, the $p^+$ contact $SiO_2$ mask 78 is removed.

In step n, the impurity regions 73, 75, 77, and 79 formed in the SiC epitaxial layer on the SiC substrate are activated by annealing in the above-mentioned ambient according to the present invention. In step o, a gate oxide film 80 is formed on the surface of the annealed SiC substrate. The surface having high flatness obtained by the annealing process using the substrate heating apparatus according to the present invention makes it possible to prevent a decrease in channel mobility without deteriorating the reliability of the gate oxide film. Finally, in step p, the structure of the SiC-DMOSFET is completed by forming a source electrode 81, gate electrode 82, source electrode 83, and drain electrode 84. The semiconductor fabrication method using the heating apparatus of the present invention is applicable to methods of fabricating a diode, bipolar transistor, junction field effect transistor (JFET), MES field effect transistor, and MOS field effect transistor using a silicon carbide substrate.

The preferred embodiments of the present invention have been explained above with reference to the accompanying drawings. However, the present invention is not limited to these embodiments, and can be changed into various forms within the technical scope grasped from the description of the scope of claims.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2006-331251 filed Dec. 8, 2006 and 2007-294859 filed Nov. 13, 2007, which are hereby incorporated by reference herein in their entirety.

What is claimed is:

1. A semiconductor fabrication method having a substrate heating step of heating, using a substrate heating apparatus having a heater to heat a substrate placed in a process chamber, a suscepter installed between the heater and the substrate, and on which the substrate is mounted; and a heat receiving member installed to cover the substrate from above the suscepter, and receives heat from the heater via the suscepter, wherein the heat receiving member is installed to be placed on the suscepter, a ventilating portion is formed as a throughhole in a circumferential wall of the heat receiving member to create a space between the heat receiving member and the substrate to communicate with a space in the process chamber, a substrate placed in the process chamber adapted to be evacuated, the substrate heating step comprising steps of:

placing a substrate on the suscepter incorporating the heater;

covering the substrate from above the suscepter by the heat receiving member having the ventilating portion;

evacuating the process chamber; and heating the substrate by the heater after an interior of the process chamber has reached a predetermined vacuum degree, wherein in the step of evacuating the process chamber, a gas produced in the space formed between the heat receiving member and the substrate is evacuated through the ventilating portion.

2. The method according to claim 1, wherein a semiconductor device fabricated by the semiconductor fabrication method includes at least one of a diode, a bipolar transistor, a junction field effect transistor, a MES transistor, and a MOS field effect transistor each using a silicon carbide substrate.

3. A semiconductor fabrication method having a substrate heating step of heating, using a substrate heating apparatus, having a heater to heat a substrate placed in a process chamber; a susceptor installed between the heater and a substrate, and on which the substrate is mounted; and a heat receiving member installed to cover the substrate from above the suscepter, and receiving heat from the heater via the susceptor, wherein the heat receiving member is installed to be placed on the susceptor, a ventilating portion is formed as a through-hole in a circumferential wall of the heat receiving member to create a space between the heat receiving member and the substrate to communicate with a space in the process chamber, the substrate placed in the process chamber adapted to be evacuated, the method comprising steps of:

forming an impurity region by implanting ions into an epitaxial layer formed on the substrate; and heating the impurity region formed in the epitaxial layer by using the substrate heating apparatus.

4. The method according to claim 3, wherein a semiconductor device fabricated by the semiconductor fabrication method includes at least one of a diode, a bipolar transistor, a junction field effect transistor, a MES transistor, and a MOS field effect transistor each using a silicon carbide substrate.

5. A substrate heating apparatus for performing a heating process in a process chamber adapted to be evacuated, the apparatus comprising:

a heater to heat a substrate placed in the process chamber;

a susceptor installed between said heater and the substrate, and on which the substrate is mounted; and a heat receiving member installed to cover the substrate from above said susceptor, and receiving heat from said heater via said susceptor, wherein said heat receiving member is installed to be placed on said susceptor, a ventilating portion creates a space between said heat receiving member and the substrate to communicate with a space in the process chamber, and said ventilating portion is formed as a through-hole in a circumferential wall of said heat receiving member.

6. The apparatus according to claim 5, wherein said heat receiving member has a surface facing the substrate, said surface being coated with a pyrolytic carbon.

7. The apparatus according to claim 5, wherein said heat receiving member comprises a cap which includes a top plate and a cylindrical circumferential wall extending downward from an edge of the top plate, and isolates the substrate from the space in the process chamber by covering the substrate from above said susceptor, and said ventilating portion is formed in said circumferential wall of said cap, and said circumferential wall is arranged to be in contact with said susceptor.

8. A substrate heating apparatus for performing a heating process in a process chamber adapted to be evacuated, the apparatus comprising:

a heater to heat a substrate placed in the process chamber;

a susceptor installed between said heater and the substrate, and on which the substrate is mounted; and a heat receiving member installed to cover the substrate from above said susceptor, and receiving heat from said heater via said susceptor, wherein said heat receiving member is installed to be placed on said susceptor, a ventilating portion in said heat receiving member allows the substrate to communicate with a space in the process chamber, wherein said heat receiving member comprises a cap-like member made of a net material which isolates the substrate from the space in the process chamber by covering the substrate from above said susceptor, and said ventilating portion comprises meshes of said cap-like member made of said net material.

9. A substrate heating apparatus for performing a heating process on a substrate placed in a process chamber adapted to be evacuated, the apparatus comprising:

a heater to heat a substrate placed in the process chamber;

a susceptor installed between said heater and the substrate, and on which the substrate is mounted; and a heat receiving member installed to cover the substrate from above said susceptor, and receiving heat from said heater via said susceptor, wherein said heat receiving member is installed to be placed on said susceptor, a ventilating portion in said heat receiving member allows the substrate to communicate with a space in the process chamber, wherein said heat receiving member comprises a cylindrical support member adapted to support a circumferential edge of the substrate by a step portion formed on an inner circumferential wall of a middle portion between an upper end opening and a lower end opening, and a cover member installed to be placed on the upper end opening of said support member and to close the upper end opening, and said ventilating portion is formed in said cover member.

10. A substrate heating apparatus for performing a heating process on a substrate placed in a process chamber adapted to be evacuated, the apparatus comprising:

a heater to heat a substrate placed in the process chamber;

a susceptor installed between said heater and a substrate, and on which the substrate is mounted; and a heat receiving member installed to cover the substrate from above said susceptor, and receiving heat from said heater via said susceptor, wherein said heat receiving member is installed to be placed on said susceptor, a ventilating portion in said heat receiving member allows the substrate to communicate with a space in the process chamber, wherein said heat receiving member comprises a cylindrical support member adapted to support a circumferential edge of the substrate by a step portion formed on an inner circumferential wall of a middle portion between an upper end opening and a lower end opening, and a cover member installed to be placed on the upper end opening of said support member to close the upper end opening, and said ventilating portion is formed in a circumferential wall between the step portion formed on said inner circumferential wall of said middle portion and the upper end opening.

* * * * *